(12) United States Patent
Horiuchi (10) Patent No.: US 9,599,893 B2
(45) Date of Patent: Mar. 21, 2017

(54) PRODUCTION PROCESS FOR OPTICALLY SHAPED PRODUCT AND PRODUCTION PROCESS FOR LIQUID DISCHARGE HEAD

(71) Applicant: CANON KABUSHIKI KAISHA, Tokyo (JP)

(72) Inventor: Isamu Horiuchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/828,736

(22) Filed: Aug. 18, 2015

(65) Prior Publication Data

US 2016/0091789 A1 Mar. 31, 2016

(30) Foreign Application Priority Data

Sep. 25, 2014 (JP) .................................. 2014-194701
Jun. 30, 2015 (JP) .................................. 2015-130967

(51) Int. Cl.
*G03F 7/038* (2006.01)
*G03F 7/16* (2006.01)
(Continued)

(52) U.S. Cl.
CPC .......... *G03F 7/0005* (2013.01); *B41J 2/1603* (2013.01); *B41J 2/1631* (2013.01); *B41J 2/1639* (2013.01);
(Continued)

(58) Field of Classification Search
None
See application file for complete search history.

(56) References Cited

U.S. PATENT DOCUMENTS 5,335,004 A * 8/1994 Matsuhisa .............. B41J 2/1604
216/27
5,859,655 A * 1/1999 Gelorme ................ B41J 2/1603
347/65
(Continued)

FOREIGN PATENT DOCUMENTS

EP 0 453 581 A1 10/1991
EP 0 931 656 A1 7/1999
(Continued)

OTHER PUBLICATIONS

Mitsubishi Chemical Corporation, "General grade Catalog jER" 7 pages (Apr. 2012).*
(Continued)

*Primary Examiner* — Martin Angebranndt
(74) *Attorney, Agent, or Firm* — Fitzpatrick, Cella, Harper & Scinto (57) ABSTRACT

A production process for an optically shaped product, including applying a photosensitive resin composition in a form of a dry film on to a substrate in which a hole opening to a surface thereof is formed so as to cover the hole and performing patterning to form an optically shaped product, wherein the photosensitive resin composition contains a resin comprising a tri- or higher functional epoxy resin and a bifunctional epoxy resin, the bifunctional epoxy resin has a weight-average molecular weight (Mw) of 5,500 to 60,000, the resin has a weight-average molecular weight (Mw) ranging from 4,500 to 11,000, and the mixing ratio by mass between the tri- or higher functional epoxy resin and the bifunctional epoxy resin satisfies (b)/(a)≤1.5, where (a) is the mass of the tri- or higher functional epoxy resin, and (b) is the mass of the bifunctional epoxy resin.

16 Claims, 6 Drawing Sheets

(51) Int. Cl.
*G03F 7/004* (2006.01)
*G03F 7/30* (2006.01)
*B41J 2/16* (2006.01)
*G03F 7/00* (2006.01)
*G03F 7/095* (2006.01)
*G03F 7/32* (2006.01)
*B41J 2/14* (2006.01)

(52) U.S. Cl.
CPC .......... *B41J 2/1645* (2013.01); *G03F 7/0045* (2013.01); *G03F 7/038* (2013.01); *G03F 7/095* (2013.01); *G03F 7/16* (2013.01); *G03F 7/325* (2013.01); *B41J 2002/14475* (2013.01)

(56) References Cited

U.S. PATENT DOCUMENTS

| | | | |
|---|---|---|---|
| 6,409,931 B1 | 6/2002 | Shimomura et al. | |
| 7,856,717 B2 | 12/2010 | Kwon et al. | |
| 8,273,524 B2 | 9/2012 | Horiuchi et al. | |
| 2006/0188820 A1* | 8/2006 | Maeda | B41J 2/162 430/280.1 |
| 2007/0076059 A1* | 4/2007 | Patil | B41J 2/1603 347/65 |
| 2008/0213596 A1* | 9/2008 | Takahashi | B32B 27/38 428/413 |
| 2009/0087791 A1* | 4/2009 | Sakamoto | B41N 3/08 430/302 |
| 2010/0068648 A1 | 3/2010 | Senzaki et al. | |
| 2011/0123928 A1* | 5/2011 | Senzaki | G03F 7/0045 430/280.1 |
| 2012/0047738 A1* | 3/2012 | Koyama | B41J 2/1604 29/890.1 |
| 2013/0017496 A1* | 1/2013 | Matsumoto | B41J 2/1603 430/320 |
| 2013/0244183 A1 | 9/2013 | Shiba et al. | |
| 2014/0083974 A1* | 3/2014 | Matsumoto | B41J 2/1603 216/41 |

FOREIGN PATENT DOCUMENTS

| | | | |
|---|---|---|---|
| EP | 2 743 286 A1 | | 6/2014 |
| JP | 2008-180879 | * | 8/2008 |
| JP | 2009-1003 A | | 1/2009 |

OTHER PUBLICATIONS

Extended European Search Report in European Application No. 15002614.4 (dated Feb. 25, 2016).

* cited by examiner

PRODUCTION PROCESS FOR OPTICALLY SHAPED PRODUCT AND PRODUCTION PROCESS FOR LIQUID DISCHARGE HEAD

BACKGROUND OF THE INVENTION

Field of the Invention

The present invention relates to a production process for an optically shaped product and a production process for a liquid discharge head using this production process.

Description of the Related Art

As an example of an optically shaped product, a liquid discharge head discharging a liquid may be mentioned. The liquid discharge head is used for discharging an ink in an ink jet recording apparatus as, for example, an ink jet recording head. The liquid discharge head applied to the ink jet recording generally includes plural fine discharge ports, flow paths respectively communicating with the discharge ports and discharge energy generating elements each provided at a part of the flow path for generating energy for discharging a liquid within the flow path. As a production process for such a liquid discharge head, a process of laminating a low-sensitive photosensitive resin layer forming a flow path and a high-sensitive photosensitive resin layer which will become a discharge port by patterning on a substrate in which a discharge energy generating element has been provided in advance is known. The low-sensitive photosensitive resin layer and the high-sensitive photosensitive resin layer are respectively cured, and uncured portions thereof are then removed, thereby forming the flow path and the discharge port on the substrate.

In the production process for an ink jet recording head disclosed in Japanese Patent Application Laid-Open No. 2009-1003, a film of a low-sensitive photosensitive resin which is liquid is first formed on a substrate by a spin-coating method, and the film is exposed to be in a form of a flow path. After a dry film of a high-sensitive photosensitive resin is then laminated on the resultant low-sensitive photosensitive resin layer and exposed to be in a form of a discharge port, uncured portions of the low-sensitive photosensitive resin layer and the high-sensitive photosensitive resin layer are collectively removed to form the flow path and the discharge port. Thereafter, the substrate is etched from a surface on which none of the photosensitive resin layers was laminated to form a supply path for supplying a liquid to the flow path passing through the substrate.

SUMMARY OF THE INVENTION

According to the present invention, there is provided a production process for an optically shaped product, which comprises applying a photosensitive resin composition in a form of a dry film on to a substrate in which a hole opening to a surface thereof is formed so as to cover the hole and performing patterning to form an optically shaped product, wherein the photosensitive resin composition contains a resin comprising a tri- or higher functional epoxy resin and a bifunctional epoxy resin, the bifunctional epoxy resin has a weight-average molecular weight (Mw) of 5,500 to 60,000, the resin has a weight-average molecular weight (Mw) ranging from 4,500 to 11,000, and a mixing ratio by mass between the tri- or higher functional epoxy resin and the bifunctional epoxy resin satisfies (b)/(a)≤1.5, where (a) is a mass of the tri- or higher functional epoxy resin, and (b) is a mass of the bifunctional epoxy resin.

According to the present invention, there is also provided a production process for a liquid discharge head, which comprises applying a photosensitive resin composition in a form of a dry film on to a substrate in which a discharge energy generating element and a liquid supply path for liquid are formed, wherein the photosensitive resin composition contains a resin comprising a tri- or higher functional epoxy resin and a bifunctional epoxy resin, the bifunctional epoxy resin has a weight-average molecular weight (Mw) of 5,500 to 60,000, the resin has a weight-average molecular weight (Mw) ranging from 4,500 to 11,000, and a mixing ratio by mass between the tri- or higher functional epoxy resin and the bifunctional epoxy resin satisfies (b)/(a)≤1.5, where (a) is a mass of the tri- or higher functional epoxy resin, and (b) is a mass of the bifunctional epoxy resin.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

In the production process for the ink jet recording head described in Japanese Patent Application Laid-Open No. 2009-1003, a low-sensitive photosensitive resin layer is formed on a substrate by a spin-coating method, so that the formation of a supply path is conducted only after the formation of the low-sensitive photosensitive resin layer. In addition, etching for forming the supply path in the substrate can be conducted only from the surface on which no photosensitive resin layer is formed, so that the step for forming the supply path is highly restricted. On the other hand, in order to form the low-sensitive photosensitive resin layer on a substrate in which a supply path which is a through-hole is formed in advance, there is a method of forming a dry film of a low-sensitive photosensitive resin and then transferring this dry film on to the substrate. According to this method, however, both dry films of the low-sensitive photosensitive resin and a high-sensitive photosensitive resin fall in the interior of the supply path at the opening of the supply path when the dry film of the high-sensitive photosensitive resin is further transferred, and so the heights of the respective photosensitive resin layers after curing may become uneven in some cases. When such height unevenness occurs, a flow path height and a discharge port height become uneven, so that discharge accuracy in the ink jet recording head produced is lowered. Here, the discharge port height means a distance from the surface of the substrate to a position of the discharge port. The problem in the production process for the ink jet recording head has been described here. However, this problem is common to a production process for an optically shaped product by transferring a photosensitive resin layer which is a dry film on to a substrate in which an opening or a recessed portion is provided in advance.

It is an object of the present invention to provide a production process for an optically shaped product, by which falling-in of a photosensitive resin layer into a recessed portion or a through-hole is small upon the formation of the optically shaped product by using a substrate having the recessed portion or the through-hole, and the height of the photosensitive resin layer after curing is controlled.

Another object of the present invention is to provide a production process for a liquid discharge head by laminating a photosensitive resin layer on a substrate in which a supply path is formed in advance, by which falling-in of the photosensitive resin layer into the supply path is small, and a flow path height and a discharge port height can be made even.

Preferred embodiments of the present invention will now be described in detail in accordance with the accompanying drawings. A case where a production process for an optically shaped product based on the present invention is applied to the production of a liquid discharge head will hereinafter be described as an example. However, the production process for the optically shaped product according to the present invention is not limited to the application to the production of the liquid discharge head.

Figure 1A:
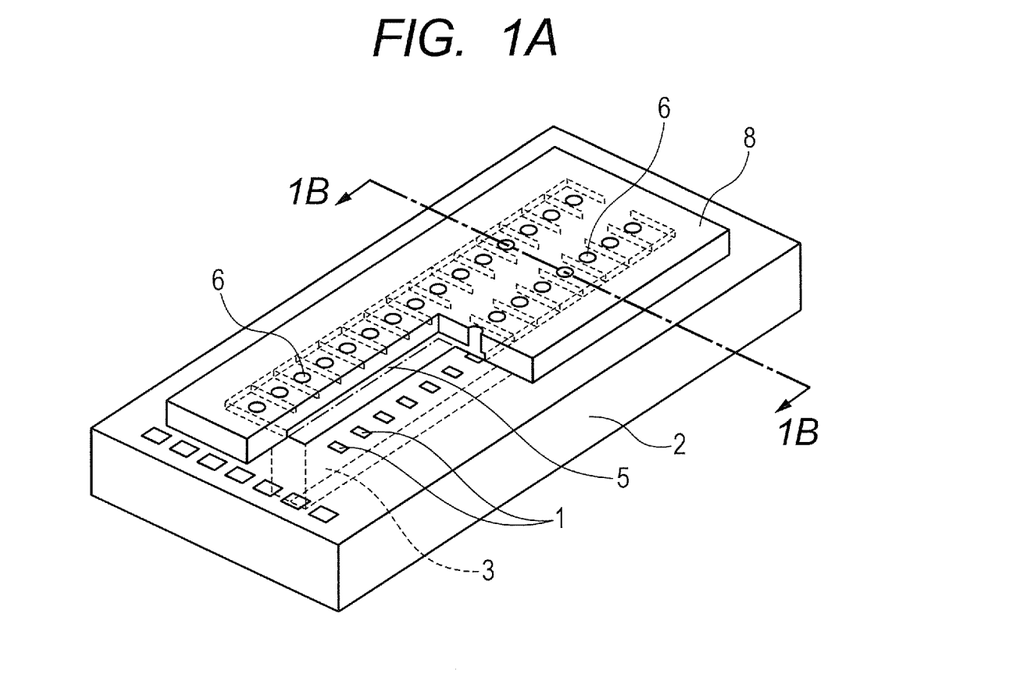
FIG. 1A is a schematic perspective view illustrating an example of the construction of a liquid discharge head.
Figure 1B:
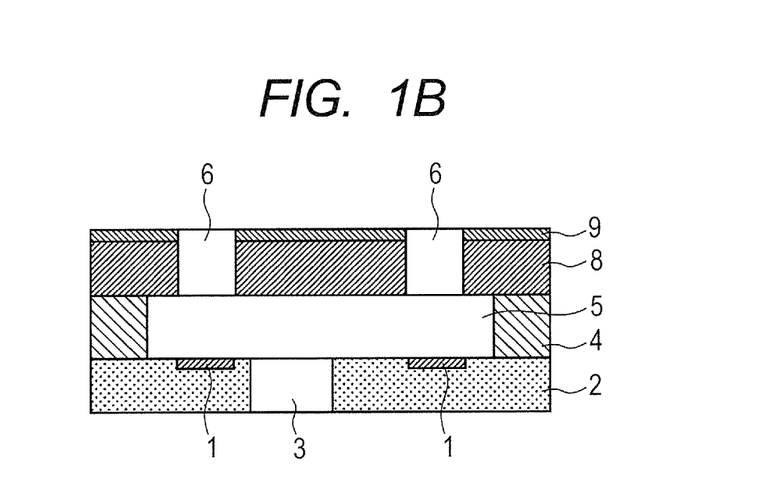
FIG. 1B is a schematic sectional view taken along line 1B-1B in FIG. 1A.

FIG. 1A is a schematic perspective view illustrating a liquid discharge head produced according to a production process of this embodiment, and FIG. 1B is a schematic sectional view taken along line 1B-1B in FIG. 1A and illustrates a sectional construction at a surface perpendicular to a substrate. This liquid discharge head has a substrate 2 in which a plurality of discharge energy generating elements 1 for generating energy utilized for discharging a liquid are formed at predetermined pitches. A supply path 3 for liquid is provided as a through-hole in the substrate 2. Side walls of a flow path 5 are formed on one surface of the substrate 2 by a flow path forming member 4, and a discharge port forming member 8 in which a discharge port 6 is provided as a through-hole is formed on the flow path forming member 4 and the flow path 5. In addition, a water-repellent layer 9 is formed on the discharge port forming member 8 as needed. This liquid discharge head discharges a liquid supplied through the flow path 5 from the supply path 3 as a droplet from the discharge port 6 by applying a pressure generated by the discharge energy generating element 1 to the liquid.

Figure 2A:
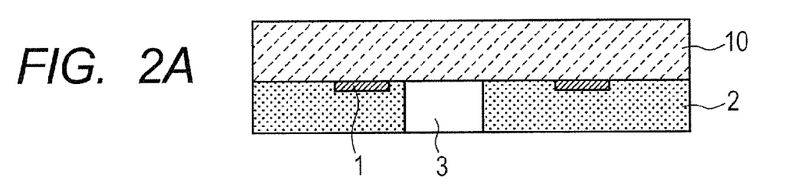
FIGS. 2A, 2B, 2C, 2D and 2E are schematic sectional views illustrating an example of steps for producing the liquid discharge head illustrated in FIGS. 1A and 1B in order.

A production process for the liquid discharge head illustrated in FIGS. 1A and 1B will now be described. FIGS. 2A to 2E are schematic sectional views illustrating steps for producing the liquid discharge head in this embodiment in order. FIG. 2E illustrates a view viewed at the same sectional position as FIG. 1B, which illustrates a state of completion. In this embodiment, two kinds of photosensitive resin compositions of a photosensitive resin composition (1) and a photosensitive resin composition (2) are used as described below. These photosensitive resin compositions are different in sensitivity to light used for patterning, and the photosensitive resin composition (2) has sensitivity higher than the photosensitive resin composition (1). Here, the sensitivity means an amount of exposure which is necessary for curing the photosensitive resin compositions, and the photosensitive resin composition with higher sensitivity is cured with a smaller amount of exposure.

After the photosensitive resin composition (1) is first applied on to a film substrate composed of polyethylene terephthalate (PET) or polyimide, the photosensitive resin composition (1) is transferred on to a substrate 2 in which a discharge energy generating element is arranged by means of a laminating method, thereby forming a film. A first photosensitive resin composition layer 10 composed of an uncured photosensitive resin composition (1) is thereby formed on the substrate 2 as illustrated in FIG. 2A. A supply path 3 is provided in the substrate 2, and the supply path 3 forms a hole opening to surfaces of the substrate 2. The first photosensitive resin composition layer 10 is formed so as to cover this hole and applied in a form of a dry film to the surface of the substrate 2. The photosensitive resin composition (1) constituting the first photosensitive resin composition layer 10 is a negative photosensitive epoxy resin composition containing a resin comprising a tri- or higher functional epoxy resin (a) and a bifunctional epoxy resin (b). The composition thereof will be described in detail below.

Figure 2B:
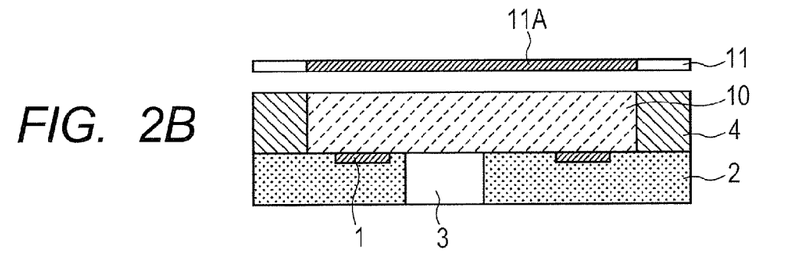

The first photosensitive resin composition layer is then subjected to pattern exposure through a flow path forming mask 11 having a flow path pattern, and the exposed portion is cured by additionally conducting a heat treatment (post exposure bake) to form a flow path forming member 4 as illustrated in FIG. 2B. The unexposed portion remains as an uncured first photosensitive resin composition layer 10. The flow path forming mask 11 is a photomask and is obtained by forming a light shielding film 11A such as a chromium film according to a pattern such as a flow path on a substrate composed of a material such as glass or quartz transmitting light of an exposure wavelength. As an exposure apparatus, a light source of a single wavelength, such as an i-line exposure stepper or a KrF stepper, or a projection exposure apparatus having a light source of a broad wavelength of a mercury lamp, such as Mask Aligner MPA-600 Super (trade name, manufactured by Canon Inc.), may be used.

Figure 2C:
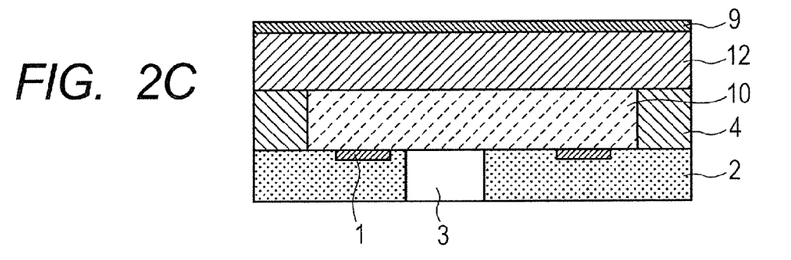

The photosensitive resin composition (2) is then applied on to a film substrate composed of PET or polyimide to form a film. Thereafter, the photosensitive resin composition (2) is transferred in a form of a dry film on to the first photosensitive resin composition layer 10 and the flow path forming member 4 by means of a laminating method to form a second photosensitive resin composition layer 12. Accordingly, the photosensitive resin composition (2) is laminated in a form of a dry film on the photosensitive resin composition (1). A water-repellent layer 9 is additionally formed on the second photosensitive resin composition layer 12 as needed as illustrated in FIG. 2C. An epoxy-resin-based negative epoxy resin composition is suitably used as the photosensitive resin composition (2). The composition thereof will be described in detail below.

The water-repellent layer 9 is required to have repellency with respect to a liquid discharged from the liquid discharge head. A perfluoroalkyl composition or perfluoropolyether composition having cationic polymerizability is suitably used as the water-repellent layer 9. The perfluoroalkyl composition or perfluoropolyether composition is generally known to segregate a fluorinated alkyl chain at an interface between the composition and air by a bake treatment after the application thereof. The water-repellency of the surface of the composition can be enhanced by this segregated fluorinated alkyl chain.

Figure 2D:
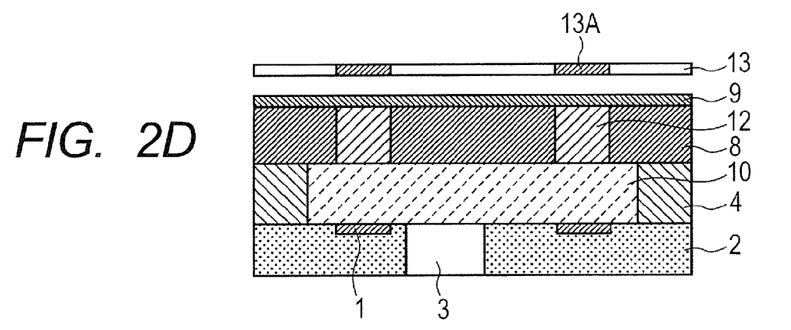
Figure 2E:
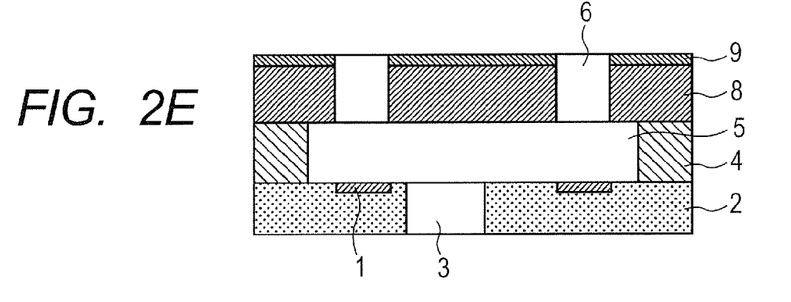

The second photosensitive resin composition layer 12 and the water-repellent layer 9 are then subjected to pattern exposure through a discharge port forming mask 13 having a discharge port pattern, and the exposed portion is cured by additionally conducting a heat treatment (post exposure bake) to form a discharge port forming member 8 as illustrated in FIG. 2D. At this time, when the exposure is conducted with light of a single wavelength, it is necessary to set the amount of exposure for curing the second photosensitive resin composition layer 12 smaller than the amount of exposure used for curing the first photosensitive resin composition layer 10. If the quantity of light transmitted through the second photosensitive resin composition layer 12 is the amount of exposure for curing the first photosensitive resin composition layer 10 when this second photosensitive resin composition layer 12 is exposed, it is difficult to remove an unexposed portion of the first photosensitive resin composition layer 10 in a subsequent step. As a result, the flow path 5 cannot be formed. For this reason, the photosensitive resin composition (2) requires to have relatively higher sensitivity regarding the exposure than the photosensitive resin composition (1).

Figure 3A:
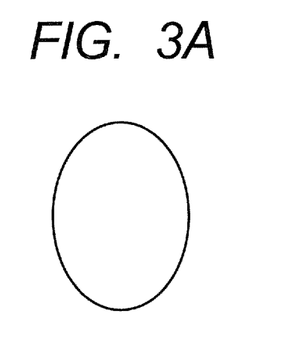
FIGS. 3A, 3B and 3C are all plan views illustrating a shape of a discharge port.
Figure 3B:
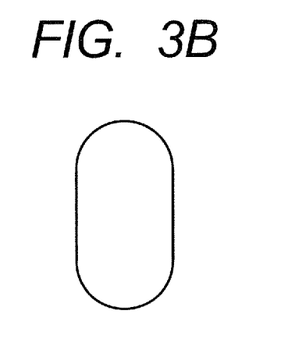
Figure 3C:
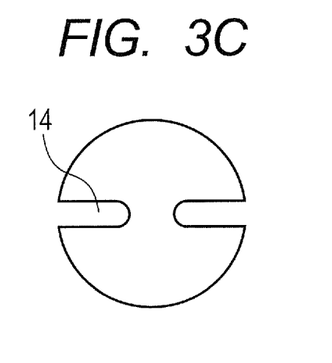

The discharge port forming mask 13 is obtained by forming a light shielding film 13A such as a chromium film according to a pattern such as a discharge port on a substrate composed of a material such as glass or quartz transmitting light of an exposure wavelength. The same apparatus as that used in the exposure of the first photosensitive resin composition layer 10 may be used as an exposure apparatus. In addition, the discharge port pattern, i.e. the plane shape of the discharge port, may not always be circular and may be suitably determined in view of, for example, discharge characteristics, including the shapes illustrated in FIGS. 3A to 3C. FIG. 3A illustrates a discharge port of an elliptical shape, and FIG. 3B illustrates a discharge port formed of an elongated opening whose both ends are formed into a semicircle. In particular, FIG. 3C illustrates a circular discharge port in which a pair of projections 14 toward a central portion thereof is provided. A discharge port of such a shape as illustrated in FIG. 3C is used, whereby a liquid can be held between the projections 14, thereby greatly reducing the situation that a droplet is divided into plural portions (main droplet and satellite) when the droplet is discharged. Accordingly, when the discharge port having the plane shape as illustrated in FIG. 3C is used in the case where the liquid discharge head is an ink jet recording head, printing of a high-quality image can be realized.

Unexposed portions of the first photosensitive resin composition layer 10, the second photosensitive resin composition layer 12 and the water-repellent layer 9 are collectively removed with an organic solvent to form a flow path 5 and a discharge port 6 as illustrated in FIG. 2E, and a heat treatment is then conducted as needed to complete a liquid discharge head.

Figure 4A:
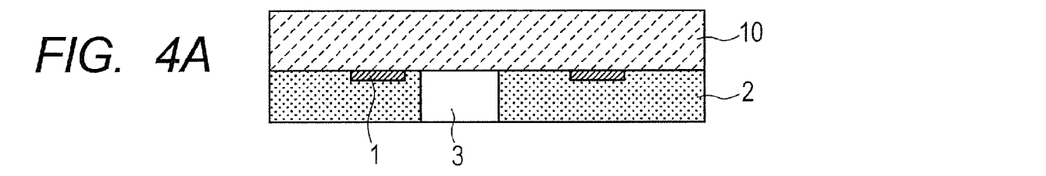
FIGS. 4A, 4B, 4C, 4D and 4E are schematic sectional views illustrating another example of steps for producing a liquid discharge head in order.
Figure 4B:
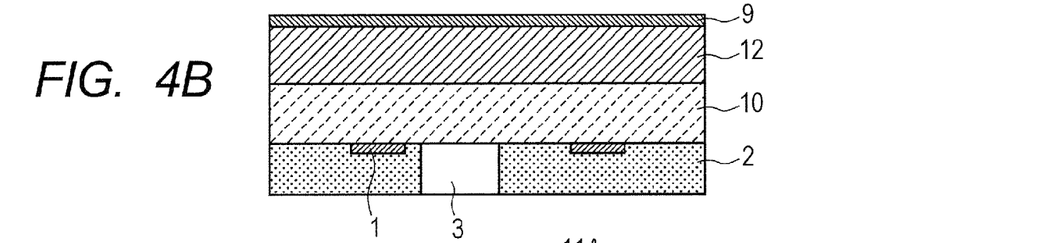
Figure 4C:
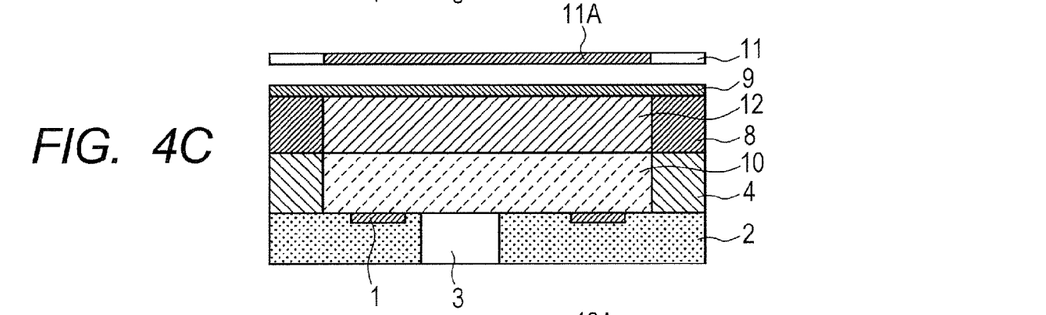
Figure 4D:
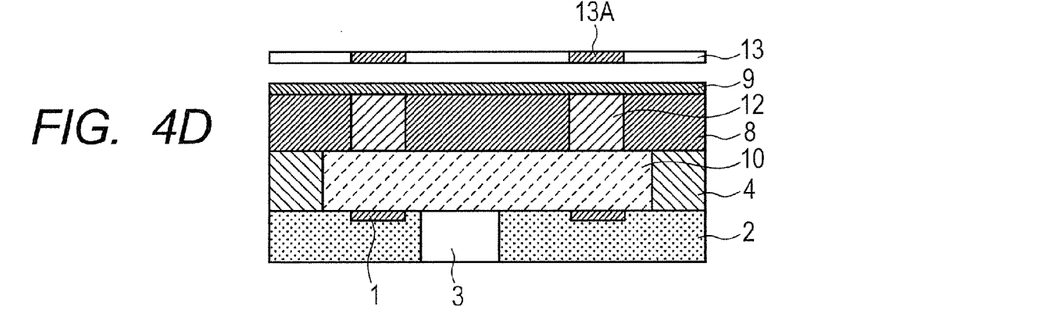
Figure 4E:
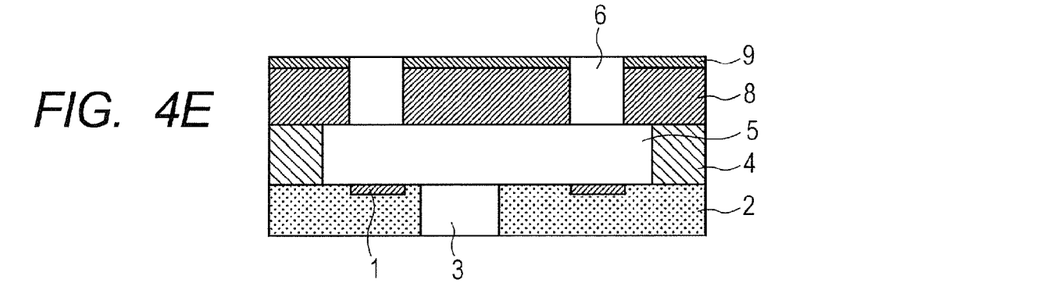

In the production process for the liquid discharge head as described above, the second photosensitive resin composition layer 12 is laminated after the first photosensitive resin composition layer 10 is exposed. However, the second photosensitive resin composition layer 12 may be laminated before the first photosensitive resin composition layer 10 is exposed. Production steps in the case where the second photosensitive resin composition layer 12 is laminated before the first photosensitive resin composition layer 10 is exposed will now be described. FIGS. 4A to 4E are schematic sectional views illustrating steps for producing a liquid discharge head in this case in order. FIG. 4E illustrates a view viewed at the same sectional position as FIG. 1B, which illustrates a state of completion.

After the same photosensitive resin composition (1) as that described above is first applied on to a film substrate composed of PET or polyimide, the photosensitive resin composition (1) is transferred on to a substrate 2 in which a discharge energy generating element 1 is arranged by means of a laminating method, thereby forming a film. A supply path 3 forming a hole opening to surfaces of the substrate 2 is provided in the substrate 2, and this hole is covered with the first photosensitive resin composition (1). A first photosensitive resin composition layer 10 composed of an uncured photosensitive resin composition (1) is thereby formed on the substrate 2 as illustrated in FIG. 4A. After the same photosensitive resin composition (2) as that described above is then applied on to a film substrate composed of PET or polyimide, the photosensitive resin composition (2) is transferred and laminated on the first photosensitive resin composition layer 10 by means of a laminating method to form a second photosensitive resin composition layer 12. In addition, a water-repellent layer 9 is formed on the second photosensitive resin composition layer 12 as needed as illustrated in FIG. 4B.

The first photosensitive resin composition layer 10 and the second photosensitive resin composition layer 12 are then subjected to pattern exposure through a flow path forming mask 11 having a flow path pattern, and a heat treatment is additionally conducted to cure exposed portions. As a result, as illustrated in FIG. 4C, a flow path forming member 4 which will become side walls of a flow path is formed, and moreover a part of a discharge port forming member 8 is formed. The second photosensitive resin composition layer 12 and the water-repellent layer 9 are then subjected to pattern exposure through a discharge port forming mask 13 having a discharge port pattern as illustrated in FIG. 4D. A heat treatment is additionally conducted to cure exposed portions, thereby forming the discharge port forming member 8 in such a manner that only a position where a discharge port is to be formed becomes an uncured portion.

Uncured portions of the first photosensitive resin composition layer 10, the second photosensitive resin composition layer 12 and the water-repellent layer 9 are collectively removed with an organic solvent to form a flow path 5 and a discharge port 6 as illustrated in FIG. 4E, and a heat treatment is conducted as needed to complete a liquid discharge head.

Even in the production process illustrated in FIGS. 4A to 4E, the photosensitive resin composition (2) forming the second photosensitive resin composition layer 12 requires to have relatively higher sensitivity regarding the exposure than the photosensitive resin composition (1) forming the first photosensitive resin composition layer 10. In addition, the exposure of the discharge port pattern may be conducted before the exposure of the flow path pattern.

The respective photosensitive resin compositions used in this embodiment will now be described.

Photosensitive Resin Composition (1):

The photosensitive resin composition (1) forming the first photosensitive resin composition layer 10 is a negative photosensitive epoxy resin composition containing a resin comprising a tri- or higher functional epoxy resin (a) and a bifunctional epoxy resin (b). In addition, this composition favorably contains a photoacid generator. A cured product of the photosensitive resin composition (1) is required to have mechanical strength and adhesion to a substrate. In addition, the photosensitive resin composition (1) needs to be selected in view of resolution as a photolithographic material. Since a layer formed of the photosensitive resin composition (1) is formed in a form of a dry film on a substrate having a recessed portion or through-hole which will become an opening at a surface, the photosensitive resin composition (1) requires to have such a film strength that the layer is not deformed even in an uncured state upon transfer or another heat step. This embodiment intends to obtain an optically shaped product in which the height of the photosensitive resin layer after curing is controlled by covering a hole with a photosensitive resin composition having such a film strength that the layer is not deformed even in an uncured state.

The photosensitive resin composition (1) contains a resin having a trivalent or higher polyvalent epoxy group as a trivalent or higher polyfunctional epoxy resin (a), whereby crosslinking is caused to three-dimensionally proceed to improve sensitivity as a photosensitive material. The tri- or higher functional epoxy resin (a) favorably has an epoxy equivalent less than 500 and a softening point of 60° C. or higher though no particular limitation is imposed on them. When the epoxy equivalent is 500 or higher, the sensitivity of the resulting resin composition becomes insufficient, so that the lowering of pattern resolution or the lowering of mechanical strength or adhesion of a cured product may be caused in some cases. In addition, when the softening point is less than 60° C., the photosensitive resin composition (1) applied on to the film substrate for forming a dry film may be softened in a production apparatus in some cases, which forms the cause of wrinkling upon formation of the first photosensitive resin composition layer by transferring the photosensitive resin composition (1) to the substrate. As examples of the tri- or higher functional epoxy resin having such favorable properties, there may be mentioned a phenol-novolak type epoxy resin, a cresol-novolak type epoxy resin, a bisphenol A-novolak type epoxy resin and a tri- or higher functional epoxy resin having an oxycyclohexane skeleton. As commercially available epoxy resins, there are mentioned "EHPE (trademark) 3150" (product of Daicel Corporation), "jER (trademark) 157S70" and "jER (trademark) 1031S" (products of Mitsubishi Chemical Corporation), and "EPICLON (trademark) N-865" and "EPICLON (trademark) N-690" (products of DIC Corporation).

Incidentally, the softening point in the present specification means a softening point measured by the ring and ball method specified in JIS K 7234.

The bifunctional epoxy resin (b) contained in the photosensitive resin composition (1) is used as a binder for improving the film strength of the photosensitive resin composition (1) and is desired to have a weight-average molecular weight higher than that of the tri- or higher functional epoxy resin. Specifically, the bifunctional epoxy resin (b) desirably has a weight-average molecular weight (Mw) of 5,500 to 60,000 and a softening point of 90° C. or more. If the weight-average molecular weight is less than 5,500, the film strength is not improved, and so the photosensitive resin composition (1) and the photosensitive resin composition (2) formed into respective films may greatly fall in the opening of the substrate in some cases upon the transfer of the photosensitive resin composition (2) on to the photosensitive resin composition (1) or upon another thermal process. When the photosensitive resin composition (1) and the photosensitive resin composition (2) greatly fall in the opening, the heights of the respective photosensitive resin composition layers become uneven. Even if the softening point is less than 90° C., the same falling-in problem may occur in some cases. If the weight-average molecular weight (Mw) is more than 60,000 on the other hand, the crosslinking density of the photosensitive resin composition (1) is lowered, and so the stability of its pattern shape is lowered. The bifunctional epoxy resin having desired properties as described above is favorably an epoxy resin having a bisphenol skeleton, particularly favorably an epoxy resin having a bisphenol A skeleton. Examples of commercially available epoxy resins include "jER (trademark) 1004", "jER (trademark) 1007", "jER (trademark) 1009", "jER (trademark) 1010" and "jER (trademark) 1256" (products of Mitsubishi Chemical Corporation), and "EPICLON (trademark) 4050" and "EPICLON (trademark) 7050" (products of DIC Corporation). The weight-average molecular weights (Mw) of these resins can be calculated in terms of polystyrene by means of a gel permeation chromatograph (manufactured by, for example Shimadzu Corporation).

The mixing ratio between the tri- or higher functional epoxy resin (a) and the bifunctional epoxy resin (b) satisfies (b)/(a) 1.5 in terms of a mixing ratio by mass, and the weight-average molecular weight (Mw) of the photosensitive resin composition (1) falls within a range of 4,500 to 11,000. In the expression indicating the mixing ratio by mass in the present specification, "(a)" is the mass of the tri- or higher functional epoxy resin (a), and "(b)" is the mass of the bifunctional epoxy resin (b). The bifunctional epoxy resin (b) is high in epoxy equivalent and low in reactivity compared with the tri- or higher functional epoxy resin (a). Accordingly, if the mixing ratio by mass is higher than 1.5, i.e., (b)/(a)>1.5, the crosslinking density of the resulting photosensitive resin composition (1) is reduced, curing thereof becomes insufficient, and pattern accuracy is reduced. If the stability of the pattern shape is reduced, an irregularity may be caused on the side walls of the pattern, and so the pattern may not be formed with desired accuracy in some cases. As a result, insufficient curing or a decrease in the stability of the pattern shape may weaken the adhesion between the photosensitive resin composition (1) and the substrate in some cases. Also, on the one hand, if the weight-average molecular weight (Mw) of the photosensitive resin composition (1) is more than 11,000, even when the mixing ratio by mass (b)/(a) is 1.5 or less, the crosslinking density is reduced to cause the same problem. If the weight-average molecular weight (Mw) of the photosensitive resin composition (1) is less than 4,500, on the other hand, the film strength of the photosensitive resin composition (1) becomes insufficient, and the falling-in at the opening of the substrate occurs.

The photoacid generator is favorably a sulfonic acid compound, a solfonium salt compound, an iodonium salt compound, a disulfone-based compound or a phosphoric acid compound. Examples of commercially available products thereof include "ADEKA OPTOMER SP-170", "ADEKA OPTOMER SP-172" and "ADEKA OPTOMER SP-150" (all, trade names, products of ADEKA CORPORATION), "BBI-103" and "BBI-102" (both, trade names, products of Midori Kagaku Co., Ltd.), "IBPF", "IBCF", "TS-01" and "TS-91" (all, trade names, products of SANWA CHEMICAL CO., LTD.), "CPI-210", "CPI-300" and "CPI-410" (all, trade names, products of San-Apro Ltd.), and "Irgacure (trademark) 290" (product of BASF Japan Ltd.). These photoacid generators may also be used in any combination thereof. In addition, a silane coupling agent may also be added for the purpose of improving adhesion. Examples of commercially available silane coupling agents include "A-187" (trade name, product of Momentive Performance Materials Inc.). Further, a sensitizer such as an anthracene compound, a basic substance such as an amine or an acid generator generating toluenesulfonic acid which is weakly acidic (pKa=−1.5 to 3.0) may also be added for the purpose of improving pattern resolution and controlling sensitivity. Examples of commercially available acid generators which generate toluenesulfonic acid include "TPS-1000" (trade name, product of Midori Kagaku Co., Ltd.) and "WPAG-367" (trade name, product of Wako Pure Chemical industries, Ltd.).

Photosensitive Resin Composition (2):

The photosensitive resin composition (2) requires that its cured product has mechanical strength and further requires to take resolution as a photographic material into consideration. Therefore, a negative epoxy resin composition containing, as a main component, an epoxy resin such as a bisphenol A novolak type epoxy resin, a phenol novolak type epoxy resin, a cresol novolak type epoxy resin or a tri- or higher functional epoxy resin having an oxycyclohexane skeleton is suitably used as the photosensitive resin composition (2). The use of the epoxy resin having a tri- or higher valent epoxy group enables three-dimensionally crosslinking of the cured product, and is suitable for obtaining desired properties. Examples of commercially available epoxy resins usable in the photosensitive resin composition (2) include "CELLOXIDE (trademark) 2021", "GT-300 Series" and "GT-400 Series" (both, trade names) and "EHPE (trademark) 3150" (all, products of Daicel Corporation), "jER (trademark) 157S70" (product of Mitsubishi Chemical Corporation), and "EPICLON (trademark) N-690" and "EPICLON (trademark) N-865" (products of DIC Corporation). A photopolymerization initiator to be added into the above-described epoxy resin composition is favorably a sulfonic acid compound, a diazomethane compound, a solfonium salt compound, an iodonium salt compound or a disulfone-based compound. Examples of commercially available products thereof include "ADEKA OPTOMER SP-170", "ADEKA OPTOMER SP-172" and "ADEKA OPTOMER SP-150" (all, trade names, products of ADEKA CORPORATION), "BBI-103" and "BBI-102" (both, trade names, products of Midori Kagaku Co., Ltd.), "IBPF", "IBCF", "TS-01" and "TS-91" (all, trade names, products of SANWA CHEMICAL CO., LTD.), "CPI-210", "CPI-300" and "CPI-410" (all, trade names, products of San-Apro Ltd.), and "Irgacure (trademark) 290" (product of BASF Japan Ltd.). In addition, a silane coupling agent may also be added into the photosensitive resin composition (2) for the purpose of improving adhesion. Examples of commercially available silane coupling agents include "A-187" (trade name, product of Momentive Performance Materials Inc.). Further, a sensitizer such as an anthracene compound, a basic substance such as an amine and an acid generator which generates toluenesulfonic acid and is weakly acidic (pKa=−1.5 to 3.0) may also be added for the purpose of improving pattern resolution and controlling sensitivity. Examples of commercially available acid generators which generate toluenesulfonic acid include "TPS-1000" (trade name, product of Midori Kagaku Co., Ltd.) and "WPAG-367" (trade name, product of Wako Pure Chemical industries, Ltd.).

Further, "SU-8 Series" (trade name) and "KMPR (trademark) 1000" (products of MicroChem Corp.), and "TMMR (trademark) 52000" and "TMMF (trademark) 52000" (products of TOKYO OHKA KOGYO CO., LTD.) which are commercially available as negative resists may also be used for the photosensitive resin composition (2).

The present invention will hereinafter be described in more detail by the following Examples. However, the present invention is not limited to these Examples.

Examples 1 to 21

In respective Examples, photosensitive resin compositions (1) were prepared according to their corresponding compositions shown in Tables 1 and 2. Incidentally, in both Tables, the compositions are indicated by parts by mass, and the product names in both Tables conform to the trade names of the epoxy resins and chemicals mentioned above as favorably usable products. In addition, polyethylene glycol monomethacrylate (PEGMA) was used as a solvent dissolving the photosensitive resin composition. A photoacid generator (CPI-210S) was added at a proportion of 0.5% by mass to the total mass of a tri- or higher functional epoxy resin (a) and a bifunctional epoxy resin (b). In addition, a silane coupling agent was added at a proportion of 5% by mass to the same total mass. The weight-average molecular weights (Mw) shown in both Tables are values in terms of polystyrene as measured by means of a gel permeation chromatograph (manufactured by Shimadzu Corporation). A liquid discharge head using each of the photosensitive resin compositions of the above-described compositions was prepared according to the steps illustrated in FIGS. 5A to 5E. The steps illustrated in FIGS. 5A to 5E are the same as those illustrated in FIGS. 2A to 2E, but are different from those illustrated in FIGS. 2A to 2E in that no water-repellent layer is provided.

Figure 5A:
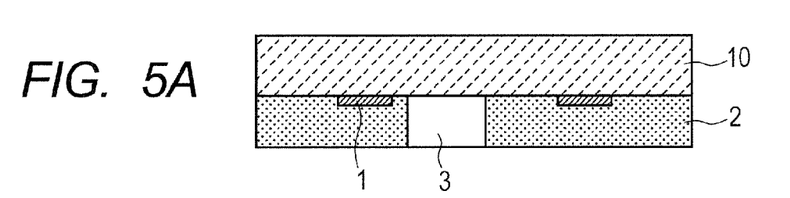
FIGS. 5A, 5B, 5C, 5D and 5E are schematic sectional views illustrating steps for producing a liquid discharge head in Examples in order.
Figure 5B:
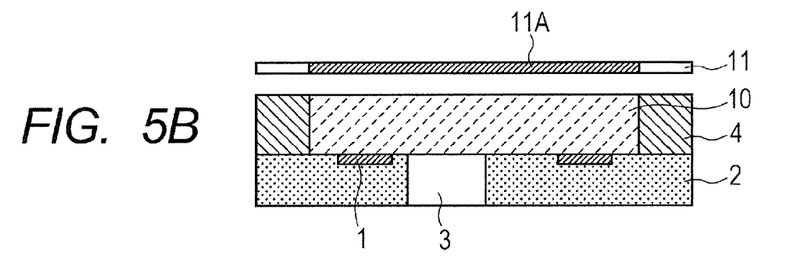

First, the photosensitive resin composition (1) was applied on to a PET film having a thickness of 100 µm and baked for 5 minutes at 90° C. to evaporate the PEGMA solvent and form a film having a thickness of 15 µm. Then, the film of the photosensitive resin composition (1) was transferred to a substrate 2 in which a discharge energy generating element 1 and a supply path 3 have been provided in advance in a form of a dry film while applying heat of 80° C. by means of a laminating method. The supply path 3 of the substrate 2 is a hole opening to surfaces of the substrate 2, and this hole was covered with the photosensitive resin composition (1). A first photosensitive resin composition layer 10 was formed as illustrated in FIG. 5A. As illustrated in FIG. 5B, the first photosensitive resin composition layer 10 was then subjected to pattern exposure in an amount of exposure of 9,000 J/m$^2$ by means of an i-line exposure stepper through a flow path forming mask 11 having a flow path pattern. The exposed portion was cured by additionally conducting a heat treatment for 5 minutes at 50° C. to form a flow path forming member 4.

Figure 5C:
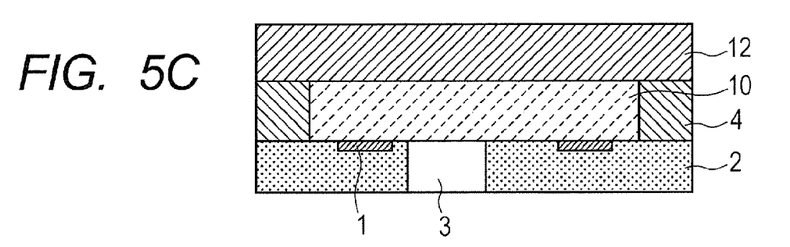
Figure 5D:
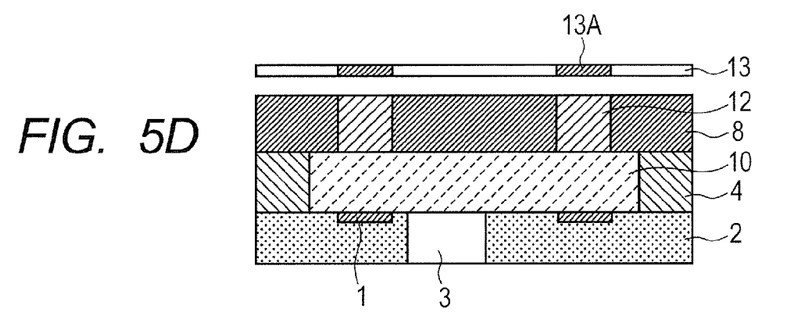
Figure 5E:
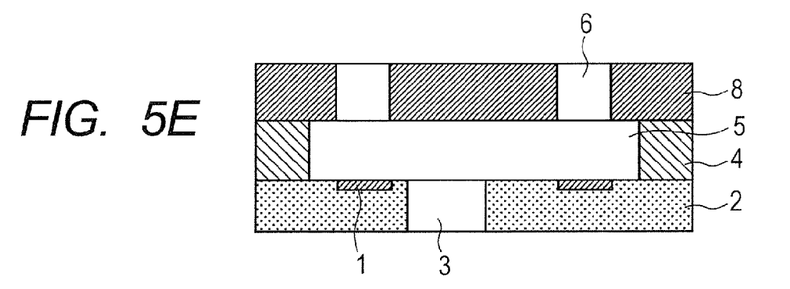

A photosensitive resin composition (2) shown in Table 3 was then applied on to a PET film having a thickness of 100 µm and baked for 5 minutes at 90° C. to form a film having a thickness of 10 µm. As illustrated in FIG. 5C, the film of the photosensitive resin composition (2) was then transferred and laminated on the first photosensitive resin composition layer 10 and the flow path forming member 4 while applying heat of 50° C. by means of a laminating method, thereby forming a second photosensitive resin composition layer 12. As illustrated in FIG. 5D, the second photosensitive resin composition layer 12 was then subjected to pattern exposure in an amount of exposure of 600 J/m$^2$ by means of an i-line exposure stepper through a discharge port forming mask 13 having a discharge port pattern. The exposed portion was cured by additionally conducting a heat treatment for 5 minutes at 90° C. to form a discharge port forming member 8. Unexposed portions of the first photosensitive resin composition layer 10 and the second photosensitive resin composition layer 12 were then collectively removed with the PGMEA solvent to form a flow path 5 and a discharge port 6. Curing was additionally conducted with heat of 200° C. to obtain a liquid discharge head as illustrated in FIG. 5E.

TABLE 1

| | Product name | Molecular weight (Mw) | Example 1 | 2 | 3 | 4 | 5 | 6 | 7 | 8 | 9 | 10 | 11 | 12 |
|---|---|---|---|---|---|---|---|---|---|---|---|---|---|---|
| Tri- or higher functional epoxy resin (a) | EPICLON N695 | 3400 | 100 | 100 | 100 | 100 | 100 | 100 | 100 | 100 | 100 | 100 | 100 | 100 |
| Bifunctional epoxy resin (b) | jER1004 | 5560 | 110 | 150 | — | — | — | — | — | — | — | — | — | — |
| | jER1007 | 11200 | — | — | 20 | 30 | 50 | 90 | 150 | — | — | — | — | — |
| | jER1009 | 22700 | — | — | — | — | — | — | — | 10 | 20 | 50 | — | — |
| | jER1256 | 58000 | — | — | — | — | — | — | — | — | — | — | 5 | 15 |
| Photoacid generator | CPI-210S | — | 1.1 | 1.3 | 0.6 | 0.7 | 0.8 | 1.0 | 1.3 | 0.6 | 0.6 | 0.8 | 0.5 | 0.6 |
| Silane coupling agent | A-187 | — | 10.5 | 12.5 | 6.0 | 6.5 | 7.5 | 9.5 | 12.5 | 5.5 | 6.0 | 7.5 | 5.3 | 5.8 |
| Solvent | PGMEA | — | 252 | 300 | 144 | 156 | 180 | 228 | 300 | 132 | 144 | 180 | 126 | 138 |
| Molecular weight of mixed resin (Mw) | | | 4520 | 4680 | 4670 | 5170 | 5970 | 7070 | 8050 | 5130 | 6590 | 9810 | 5970 | 10500 |
| Mixing ratio by mass (b)/(a) | | | 1.1 | 1.5 | 0.2 | 0.3 | 0.5 | 0.9 | 1.5 | 0.1 | 0.2 | 0.5 | 0.1 | 0.2 |
| Amount of exposure [J/m$^2$] | | | 9000 | 9000 | 9000 | 9000 | 9000 | 9000 | 9000 | 9000 | 9000 | 9000 | 9000 | 9000 |
| Falling-in amount (L) | | | B | B | B | A | A | A | A | B | A | A | A | A |
| Pattern shape | | | A | A | A | A | A | A | B | A | A | B | B | B |

TABLE 2

| | Product name | Molecular weight (Mw) | Example 13 | 14 | 15 | 16 | 17 | 18 | 19 | 20 | 21 |
|---|---|---|---|---|---|---|---|---|---|---|---|
| Tri- or higher functional epoxy resin (a) | jER157S70 | 3300 | 100 | 100 | 100 | 100 | 100 | — | — | — | — |
| | EHPE-3150 | 2500 | — | — | — | — | — | 100 | 100 | 100 | 100 |
| Bifunctional epoxy resin (b) | jER1007 | 11200 | 20 | 30 | 50 | 90 | 150 | 30 | 50 | 90 | 150 |
| Photoacid generator | CPI-210S | — | 0.6 | 0.7 | 0.8 | 1.0 | 1.3 | 0.7 | 0.8 | 1.0 | 1.3 |
| Silane coupling agent | A-187 | — | 6.0 | 6.5 | 7.5 | 9.5 | 12.5 | 6.5 | 7.5 | 9.5 | 12.5 |
| Solvent | PGMEA | — | 144 | 156 | 180 | 228 | 300 | 156 | 180 | 228 | 300 |
| Molecular weight of mixed resin (Mw) | | | 4610 | 5120 | 5930 | 7030 | 8030 | 4500 | 5390 | 6610 | 7710 |
| Mixing ratio by mass (b)/(a) | | | 0.2 | 0.3 | 0.5 | 0.9 | 1.5 | 0.3 | 0.5 | 0.9 | 1.5 |

TABLE 2-continued

| | Product name | Molecular weight (Mw) | Example 13 | 14 | 15 | 16 | 17 | 18 | 19 | 20 | 21 |
|---|---|---|---|---|---|---|---|---|---|---|---|
| Amount of exposure [J/m$^2$] | | | 9000 | 9000 | 9000 | 9000 | 9000 | 9000 | 9000 | 9000 | 9000 |
| Falling-in amount (L) | | | B | A | A | A | A | B | A | A | A |
| Pattern shape | | | A | A | A | A | B | A | A | A | B |

TABLE 3

| | Product name | Mass ratio |
|---|---|---|
| Tri- or higher functional epoxy resin | EHPE-3150 | 100 |
| Photoacid generator | Irgacure 290 | 1.0 |
| Silane coupling agent | A-187 | 5.0 |
| Solvent | PGMEA | 120 |

Examples 22 to 29

In respective Examples, PEGMA was used as a solvent to prepare photosensitive resin compositions (1) according to their corresponding compositions shown in Table 4. Proper amounts of two kinds of photoacid generators which were different in sensitivity and an acid generator (TPS-1000) were added into the photosensitive resin compositions (1). In addition, a silane coupling agent (A-187) was added in an amount of 5% by mass to the total mass of a tri- or higher functional epoxy resin (a) and a bifunctional epoxy resin (b). The composition of a photosensitive resin composition (2) was as shown in Table 5. These photosensitive resin compositions (1) and the photosensitive resin composition (2) were used to obtain liquid discharge heads according to the same production process as in Example 1. At this time, the amount of exposure to the first photosensitive resin composition layer 10 formed of the photosensitive resin composition (1) was controlled as shown in Table 4, and the amount of exposure to the second photosensitive resin composition layer 12 formed of the photosensitive resin composition (2) was controlled to 1,200 J/m$^2$.

TABLE 4

| | Product name | Molecular weight (Mw) | Example 22 | 23 | 24 | 25 | 26 | 28 | 29 |
|---|---|---|---|---|---|---|---|---|---|
| Tri- or higher functional epoxy resin (a) | EPICLON N695 | 3400 | 100 | 100 | 100 | 100 | 100 | 100 | 100 |
| Bifunctional epoxy resin (b) | jER1007 | 11200 | 50 | 50 | 50 | 50 | 50 | — | — |
| | jER1009 | 22700 | — | — | — | — | — | 20 | 20 |
| Photoacid generator | CPI-410S | — | 1.5 | 1.5 | 1.5 | 1.5 | 1.0 | 1.2 | 1.2 |
| | SP-172 | | 4.8 | 4.8 | 4.8 | — | — | 5.8 | 5.8 |
| | CPI-300 | | — | — | — | 5.4 | 3.6 | — | — |
| Acid generator | TPS-1000 | | 0.30 | 0.45 | 0.53 | 0.45 | 0.30 | 0.29 | 0.38 |
| Silane coupling agent | A-187 | | 7.5 | 7.5 | 7.5 | 7.5 | 7.5 | 6.0 | 6.0 |
| Solvent | PGMEA | — | 180 | 180 | 180 | 180 | 180 | 144 | 144 |
| Molecular weight of mixed resin (Mw) | | | 5970 | 5970 | 5970 | 5970 | 5970 | 6590 | 6590 |
| Mixing ratio by mass (b)/(a) | | | 0.5 | 0.5 | 0.5 | 0.5 | 0.5 | 0.2 | 0.2 |
| Amount of exposure [J/m$^2$] | | | 3000 | 5000 | 7000 | 5000 | 5000 | 5000 | 7000 |
| Falling-in amount (L) | | | A | A | A | A | A | A | A |
| Pattern shape | | | A | A | A | A | A | A | A |

TABLE 5

| | Product name | Mass ratio |
|---|---|---|
| Tri- or higher functional epoxy resin | jER157S70 | 100 |
| Photoacid generator | CPI-410S | 0.7 |
| Silane coupling agent | A-187 | 5.0 |
| Solvent | PGMEA | 120 |

Comparative Examples 1 to 8

In respective Examples, PEGMA was used as a solvent to prepare photosensitive resin compositions (1) according to their corresponding compositions shown in Table 6, and liquid discharge heads were obtained according to the same production process as in Example 1. The composition of the photosensitive resin composition (2) was the same as Example 1, and amounts of exposure to the respective photosensitive resin composition layers were also be the same as Example 1.

TABLE 6

| | Product name | Molecular weight (Mw) | Comparative Example | | | | | | | |
|---|---|---|---|---|---|---|---|---|---|---|
| | | | 1 | 2 | 3 | 4 | 5 | 6 | 7 | 8 |
| Tri- or higher functional epoxy resin (a) | EPICLON N695 | 3400 | 100 | 100 | 100 | 100 | 100 | 100 | 100 | 100 |
| Bifunctional epoxy resin (b) | jER1004 | 5560 | — | 50 | 200 | — | — | — | — | — |
| | jER1007 | 11200 | — | — | — | 10 | 180 | — | — | — |
| | jER1009 | 22700 | — | — | — | — | — | 5 | 80 | — |
| | jER1256 | 58000 | — | — | — | — | — | — | — | 25 |
| Photoacid generator | CPI-210S | — | 0.5 | 0.8 | 1.5 | 0.6 | 1.4 | 0.5 | 0.9 | 0.6 |
| Silane coupling agent | A-187 | — | 5.0 | 7.5 | 15.0 | 5.5 | 14.0 | 5.3 | 9.0 | 6.3 |
| Molecular weight of mixed resin (Mw) | | | 3370 | 4100 | 4830 | 4080 | 8390 | 4290 | 11960 | 14290 |
| Mixing ratio by mass (b)/(a) | | | 0.0 | 0.5 | 2.0 | 0.1 | 1.8 | 0.1 | 0.8 | 0.3 |
| Amount of exposure [J/m$^2$] | | | 9000 | 9000 | 9000 | 9000 | 9000 | 9000 | 9000 | 9000 |
| Falling-in amount (L) | | | C | C | A | C | A | C | A | A |
| Pattern shape | | | A | A | C | A | C | A | C | C |

Figure 6:
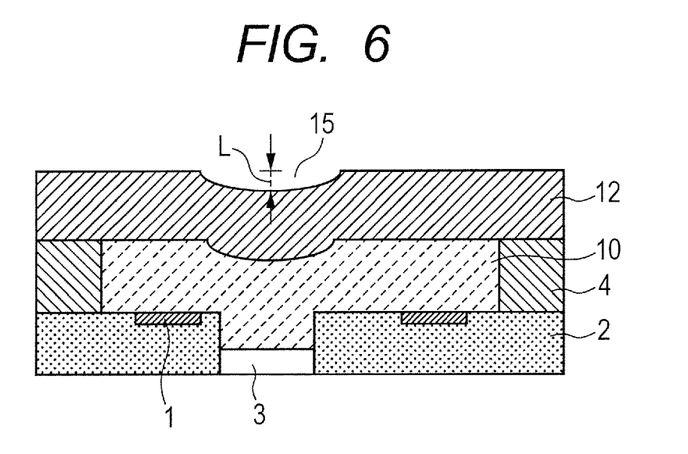
FIG. 6 is a schematic sectional view illustrating falling-in of a photosensitive resin composition layer at a position of a supply path.

Evaluation:

An ink composed of ethylene glycol/urea/isopropylalcohol/N-methylpyrrolidone/black dye/water at a mass ratio of 5/3/2/5/3/82 was filled into each of the liquid discharge heads prepared in Examples 1 to 29 and Comparative Examples 1 to 8 to conduct printing. In addition, a falling-in amount (L) which is a depth of falling-in of the photosensitive resin composition layer above the supply path 3 was measured after the lamination of the photosensitive resin composition layer 12 formed of the photosensitive resin composition (2) in the production process of each liquid discharge head. As illustrated in FIG. 6, the amount of falling-in toward the side of the supply path 3 at a position of the opening of the supply path 3 of an upper surface of the second photosensitive resin composition layer 12 which lies in an even plane in a region which does not correspond to a position of the supply path 3 was regarded as a falling-in amount (L). A laser microscope (manufactured by KEYENCE CORPORATION) was used to measure a depth from an even surface of the second photosensitive resin composition layer 12 to the deepest portion of the falling-in, and the depth was regarded as the falling-in amount (L). In addition, the correlation between the falling-in amount (L) and printing quality was confirmed. As a result, the printing quality was good in a range of 0.5 to 1.5 µm when the falling-in amount is 0.5 µm or more which can be accurately measured. However, an ink droplet was not discharged in a desired direction when the falling-in amount exceeds 1.5 µm, and so the printing quality was lowered. A falling-in amount (L) of less than 0.5 µm was difficult to accurately measure, but the printing quality was good. Thus, the evaluation criterion regarding the falling-in amount (L) was determined as shown in Table 7 to evaluate the liquid discharge heads of the respective Examples and the respective Comparative Examples. Results thereof are shown in Tables 1, 2, 4 and 6.

The flow path 5 of each liquid discharge head prepared was observed at a magnification of 100 times through a light microscope (manufactured by Nikon Corporation) for the purpose of examining patterning accuracy upon the patterning of the photosensitive resin composition layers, so as to confirm whether the ink seeks into the flow path forming member 4 or not. In addition, unevenness of pattern side walls of the flow path forming member 4 was observed at a magnification of 5,000 times through a scanning electron microscope (SEM, manufactured by Hitachi, Ltd.). The pattern shape was evaluated according to the evaluation criterion shown in Table 8 from these confirmation and observation results. Evaluation results of the pattern shape are shown in Tables 1, 2, 4 and 6.

TABLE 7

|   | Falling-in amount (L) | Printing quality |
|---|---|---|
| A | Less than 0.5 μm | Good |
| B | 0.5 μm to 1.5 | Good |
| C | Exceeding 1.5 μm | Lowered |

TABLE 8

|   | Pattern shape | Seeping of ink (light microscope) | Pattern side walls (SEM) |
|---|---|---|---|
| A |   | Not occurred | Good |
| B |   | Not occurred | Irregularity |
| C |   | Occurred | Irregularity |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-194701, filed Sep. 25, 2014 and Japanese Patent Application No. 2015-130967, filed Jun. 30, 2015 which are hereby incorporated by reference herein in their entirety.

What is claimed is:

1. A production process for an optically shaped product, comprising:
    applying a first photosensitive resin composition in a form of a dry film onto a substrate, which has a hole opening to a surface thereof, so as to cover the hole; and
    performing patterning to form an optically shaped product,
    wherein the first photosensitive resin composition contains a photoacid generator and a mixed resin of a resin comprising a tri- or higher functional epoxy resin and a bifunctional epoxy resin,
    wherein the bifunctional epoxy resin has a weight-average molecular weight (Mw) of 5,500 to 60,000,
    wherein the mixed resin has a weight-average molecular weight (Mw) from 4,500 to 11,000, and
    wherein a mixing ratio by mass between the tri- or higher functional epoxy resin and the bifunctional epoxy resin satisfies $0.3 \leq (b)/(a) \leq 1.5$, where (a) is a mass of the tri- or higher functional epoxy resin, and (b) is a mass of the bifunctional epoxy resin.

2. The production process according to claim 1, wherein the bifunctional epoxy resin is an epoxy resin having a bisphenol skeleton.

3. The production process according to claim 1, wherein the bifunctional epoxy resin has a softening point of 90° C. or more.

4. The production process according to claim 1, wherein a second photosensitive resin composition comprising a second photoacid generator is laminated on the first photosensitive resin composition in a form of a dry film.

5. The production process according to claim 4, wherein the second photosensitive resin composition comprises at least a tri- or higher functional epoxy resin.

6. The production process according to claim 1, wherein the weight-average molecular weight (Mw) of the mixed resin is from 5,120 to 7,070.

7. A production process for a liquid discharge head, comprising applying a first photosensitive resin composition in a form of a dry film on to a substrate, which has therein a discharge energy generating element and a liquid supply path,
    wherein the first photosensitive resin composition contains a photoacid generator and a mixed resin of a resin comprising a tri- or higher functional epoxy resin and a bifunctional epoxy resin,
    wherein the bifunctional epoxy resin has a weight-average molecular weight (Mw) of 5,500 to 60,000,
    wherein the mixed resin has a weight-average molecular weight (Mw) ranging from 4,500 to 11,000, and
    wherein a mixing ratio by mass between the tri- or higher functional epoxy resin and the bifunctional epoxy resin satisfies $0.3 \leq (b)/(a) \leq 1.5$, where (a) is a mass of the tri- or higher functional epoxy resin, and (b) is a mass of the bifunctional epoxy resin.

8. The production process according to claim 7, wherein the bifunctional epoxy resin is an epoxy resin having a bisphenol skeleton.

9. The production process according to claim 7, wherein the bifunctional epoxy resin has a softening point of 90° C. or more.

10. The production process according to claim 7, wherein a second photosensitive resin composition comprising a second photoacid generator is laminated on the first photosensitive resin composition in a form of a dry film.

11. The production process according to claim 10, wherein a liquid flow path is formed by patterning the first photosensitive resin composition (1).

12. The production process according to claim 10, wherein the second photosensitive resin composition comprises at least a tri- or higher functional epoxy resin.

13. The production process according to claim 10, wherein a discharge port for the liquid is formed by patterning the second photosensitive resin composition.

14. The production process according to claim 10, further comprising collectively removing an uncured portion of the first photosensitive resin composition and an uncured portion of the second photosensitive resin composition.

15. The production process according to claim 10, wherein an amount of exposure which is necessary for curing the second photosensitive resin composition is smaller than an amount of exposure which is necessary for curing the first photosensitive resin composition.

16. The production process according to claim 7, wherein the weight-average molecular weight (Mw) of the mixed resin is from 5,120 to 7,070.

* * * * *